United States Patent
Kida et al.

(10) Patent No.: US 6,459,395 B1
(45) Date of Patent: Oct. 1, 2002

(54) DIGITAL-TO-ANALOG CONVERTER AND DISPLAY UNIT WITH SUCH DIGITAL-TO-ANALOG CONVERTER

(75) Inventors: Yoshitoshi Kida; Yoshiharu Nakajima; Toshikazu Maekawa, all of Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/697,726

(22) Filed: Oct. 27, 2000

(30) Foreign Application Priority Data

Mar. 31, 1999 (JP) ........................................ 2000-096964

(51) Int. Cl.[7] ............................. H03M 1/66; H03M 1/00
(52) U.S. Cl. ........................................ 341/126; 341/144
(58) Field of Search ................................. 341/126, 144, 341/145, 154, 122, 138

(56) References Cited

U.S. PATENT DOCUMENTS

| | | | | |
|---|---|---|---|---|
| 5,014,054 A | * | 5/1991 | Oshita et al. ................ | 341/145 |
| 5,055,844 A | * | 10/1991 | Kasai ............................ | 341/144 |
| 5,160,930 A | * | 11/1992 | Hosotani et al. ............. | 341/144 |
| 5,426,430 A | * | 6/1995 | Schlig .......................... | 341/122 |
| 5,572,211 A | * | 11/1996 | Erhart et al. ................. | 341/144 |
| 5,619,203 A | * | 4/1997 | Gross, Jr. et al. ........... | 341/144 |
| 5,673,045 A | * | 9/1997 | Sato et al. ................... | 341/144 |
| 5,712,634 A | * | 1/1998 | Janssen ........................ | 341/144 |
| 5,731,775 A | * | 3/1998 | Gross, Jr. et al. ........... | 341/155 |
| 5,886,657 A | * | 3/1999 | Ahuja .......................... | 341/144 |
| 5,952,948 A | * | 9/1999 | Proebsting .................... | 341/144 |
| 5,969,658 A | * | 10/1999 | Naylor ......................... | 341/154 |
| 6,067,037 A | * | 5/2000 | Kato ............................ | 341/150 |
| 6,154,121 A | * | 11/2000 | Cairn et al. .................. | 341/138 |
| 6,157,335 A | * | 12/2000 | Suzuki et al. ................ | 341/154 |

* cited by examiner

*Primary Examiner*—Peguy Jeanpierre
*Assistant Examiner*—Jean Bruner JeanGlaude
(74) *Attorney, Agent, or Firm*—Rader, Fishman & Grauer PLLC; Ronald P. Kananen

(57) ABSTRACT

In a reference-voltage-selection-type D/A converter, the channel widths of transistors of MOS switches of gradation selecting units are weighted depending on the selected gradation. Specifically, the channel width of the MOS switches Qn11, Qn12 is represented by W0, the channel width of the MOS switches Qn13, Qp11 is represented by W1, the channel width of the MOS switches Qp12, Qn14 is represented by W2, and the channel width of the MOS switches Qp13, Qp14 is represented by W3. The channel width W3 is set to a size corresponding to the maximum capacitance of a column line, and the other channel widths W0, W1, W2 are set to satisfy the relationship: W0<W1<W2<W3. With this arrangement, the frame of a display panel which incorporates the D/A converter is reduced in size.

30 Claims, 14 Drawing Sheets

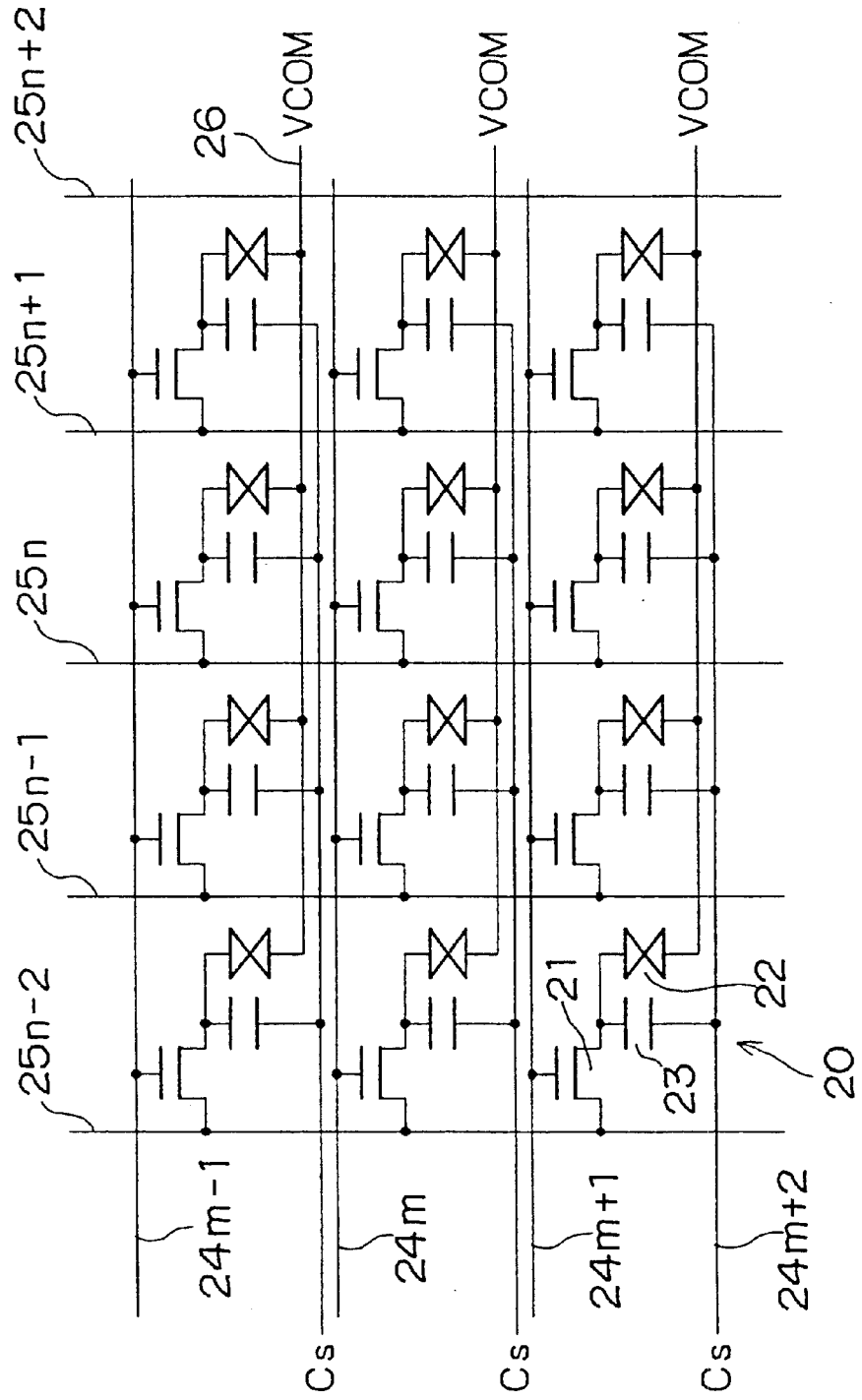
F I G. 2

CONVENTIONAL EXAMPLE

| | REFERENCE VOLTAGE LINE WIDTH (μm) | DAC SW W (μm) |
|---|---|---|
| Vref0 (BLACK) | 65 | 110 |
| Vref1 | 65 | 110 |
| Vref2 | 65 | 110 |
| Vref3 | 65 | 110 |
| Vref4 | 65 | 110 |
| Vref5 | 65 | 110 |
| Vref6 | 65 | 110 |
| Vref7 | 65 | 110 |
| Vref8 | 65 | 110 |
| Vref9 | 65 | 110 |
| Vref10 | 65 | 110 |
| Vref11 | 65 | 110 |
| Vref12 | 65 | 110 |
| Vref13 | 65 | 110 |
| Vref14 | 65 | 110 |
| Vref15 (WHITE) | 65 | 110 |
| Total (μm) | 1040 | 1760 |
| DAC CIRCUIT FRAME | | 2800 |

FIG.12B

INVENTIVE EXAMPLE

| REFERENCE VOLTAGE LINE WIDTH (μm) | DAC SW W (μm) |
|---|---|
| 65 | 90 |
| 40 | 90 |
| 65 | 80 |
| 40 | 80 |
| 65 | 80 |
| 40 | 80 |
| 65 | 80 |
| 40 | 80 |
| 65 | 80 |
| 40 | 80 |
| 65 | 80 |
| 40 | 80 |
| 65 | 80 |
| 40 | 80 |
| 65 | 110 |
| 40 | 110 |
| 840 | 1360 |
| | 2200 |

DIGITAL-TO-ANALOG CONVERTER AND DISPLAY UNIT WITH SUCH DIGITAL-TO-ANALOG CONVERTER

BACKGROUND OF THE INVENTION

The present invention relates to a digital-to-analog converter (hereinafter referred to as "D/A converter") and a display unit with such a D/A converter, and more particularly to a reference-voltage-selection-type D/A converter and a display unit such as an LCD (liquid crystal display) unit or an EL (electroluminescent) display unit with a drive circuit including such a D/A converter.

In recent years, liquid crystal display units tend to have a digital interface drive circuit integrally formed on the same panel as a pixel assembly. In the liquid crystal display units with the integral drive circuit, the pixel assembly comprises a matrix of pixels using polysilicon TFTs (thin-film transistors) as switching elements, and a horizontal drive system and a vertical drive system are disposed around the pixel assembly. The horizontal and vertical drive systems comprise TFTs and integrally formed with the pixel assembly on the same substrate (hereinafter referred to as "LCD panel").

One serious problem with the fabrication of the above liquid crystal display units with the integral drive circuit is that the digital interface drive circuit integrally formed on the LCD panel takes up a large area around the pixel assembly (such an area will hereinafter be referred to as "frame"). Particularly, in liquid crystal display units with an integral drive circuit which has a reference-voltage-selection-type D/A converter, the D/A converter takes up a large area which poses a significant problem on efforts to make the frame of LCD panels smaller.

Specifically, the reference-voltage-selection-type D/A converter comprises transistor switches between reference voltage lines which supply a plurality of reference voltages and a column line of the pixel assembly and the switch portions take up a large area in the D/A converter. Since there are required as many reference voltage lines as the number of gradations, these reference voltage lines take up a large area, i.e., the reference voltage lines extending up to the D/A converter in the LCD panel take up a large area. This large area presents an obstacle to attempts to reduce the size of the frame of LCD panels, and is responsible for making it difficult to increase the number of gradations.

SUMMARY OF THE INVENTION

It is therefore an object of the present invention to provide a D/A converter which allows the frame of a display panel to be reduced in size, and a display unit which includes such a D/A converter.

To achieve the above object, there is provided in accordance with the present invention a digital-to-analog converter comprising reference voltage generating means for generating $2^n$ reference voltages corresponding to n-bit (n is an integer of 2 or greater) digital data, $2^n$ reference voltage lines for transmitting the $2^n$ reference voltages, respectively, generated by the reference voltage generating means, and $2^n$ gradation selecting units connected between the $2^n$ reference voltage lines and an output line, for operation depending on a logic state of each of bits of the digital data. The $2^n$ gradation selecting units comprises transistor switches which have different transistor sizes depending on a selected gradation, or the $2^n$ reference voltage lines have different line widths depending on a selected gradation.

According to the present invention, there is also provided a digital-to-analog converter comprising reference voltage generating means for generating a plurality of reference voltages, resistive voltage-dividing means for generating $2^n$ reference voltages corresponding to n-bit (n is an integer of 2 or greater) digital data based on the reference voltages generated by the reference voltage generating means by way of resistive voltage division, and a gradation selecting circuit for selecting and outputting one of the $2^n$ reference voltages supplied from the resistive voltage-dividing means, depending on a logic state of each of bits of the digital data. The resistive voltage-dividing means has voltage-dividing resistors having different resistances depending on a selected gradation, or the resistive voltage-dividing means directly outputs the reference voltage for a particular gradation supplied from the reference voltage generating means as one the $2^n$ reference voltages.

The digital-to-analog converter is used in a display unit such as a liquid crystal display unit or an electroluminescent display unit which has a pixel assembly comprising a matrix of pixels. The digital-to-analog converter is incorporated in a digital interface drive circuit for selecting a desired reference voltage corresponding to digital data from as many reference voltages as the number of gradations and outputting the selected reference voltage as an analog signal. Particularly, the digital-to-analog converter is used as a digital-to-analog converter in a digital interface drive circuit disposed around the pixel assembly on the same substrate as the pixel assembly.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 2 is an equivalent circuit diagram of pixels in an effective pixel area;

FIGS. 12A and 12B are diagrams showing conventional and inventive examples;

DESCRIPTION OF THE PREFERRED EMBODIMENTS

Figure 1:
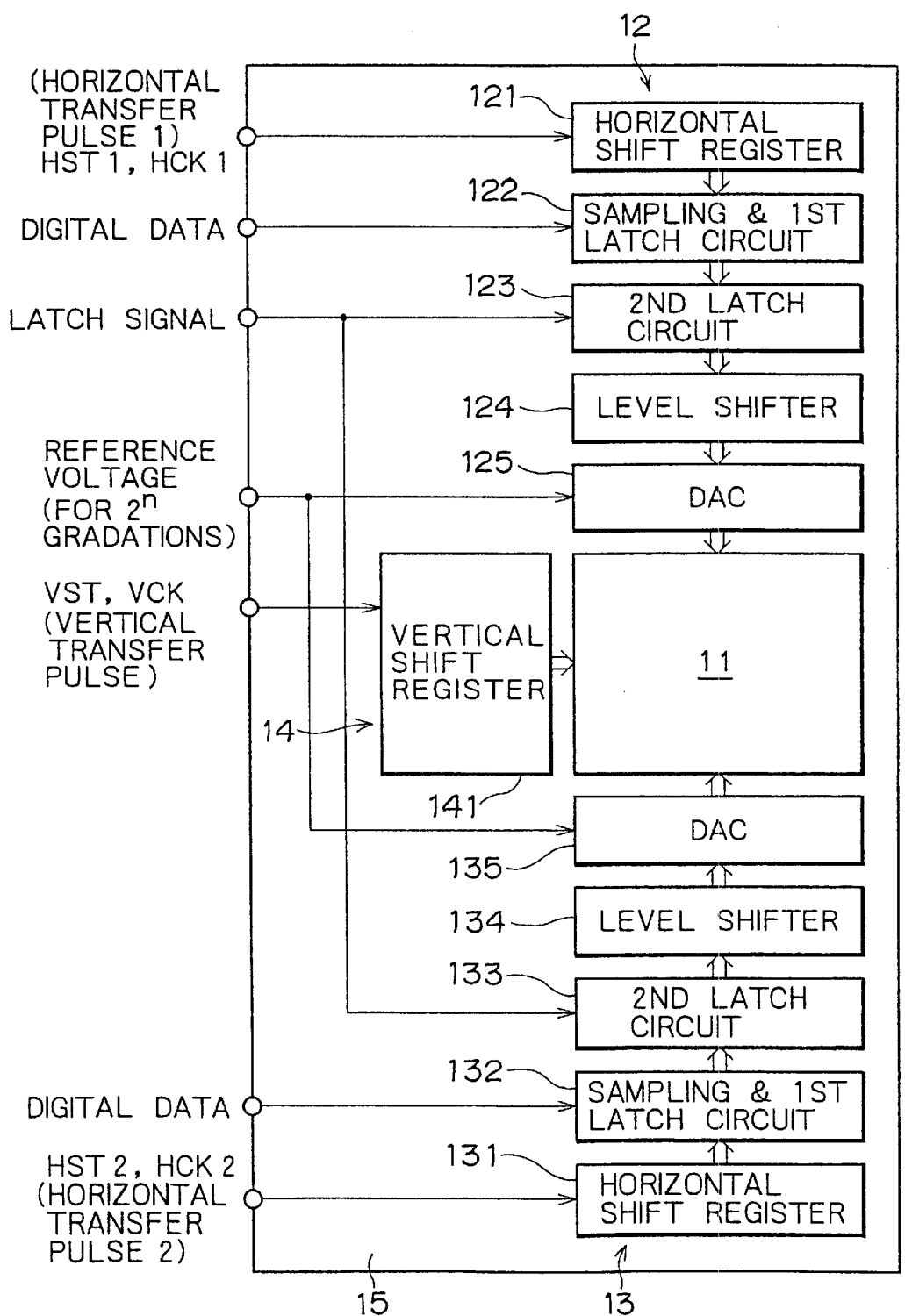
FIG. 1 is a block diagram of a system arrangement of a liquid crystal display unit with an integral drive circuit according to the present invention.

Like or corresponding reference characters denote like or corresponding parts throughout views.

FIG. 1 shows in block form a liquid crystal display unit with an integral drive circuit according to the present invention.

As shown in FIG. 1, the liquid crystal display unit has an effective pixel area (pixel assembly) 11 comprising a matrix of pixels, first and second horizontal drive systems 12, 13 disposed above and below the effective pixel area 11, and a vertical drive system 14 disposed on the left-hand side, for example, of the effective pixel area 11. The first and second horizontal drive systems 12, 13 and the vertical drive system 14 comprise TFTs (thin-film transistors) with an active layer of polysilicon, and are integrally formed on the same substrate (first substrate) as the effective pixel area 11.

A second substrate (not shown) is disposed in confronting relationship to the first substrate with a given gap left therebetween, and a liquid crystal layer is held between the first and second substrates. The first and second substrates and the liquid crystal layer jointly make up an LCD panel 15. The horizontal drive systems may not necessarily be disposed above and below the effective pixel area 11, but one horizontal drive system may be disposed above or below the effective pixel area 11. The vertical drive system may be disposed on the right-hand side of the effective pixel area 11, or two vertical drive systems may be disposed respectively on the left- and right-hand sides of the effective pixel area 11.

The first horizontal drive system 12 comprises a horizontal shift register 121, a sampling and first latch circuit 122, a second latch circuit 123, a level shifter 124, and a D/A converter (DAC) 125. Similarly, the second horizontal drive system 13 comprises a horizontal shift register 131, a sampling and first latch circuit 132, a second latch circuit 133, a level shifter 134, and a D/A converter (DAC) 135. The vertical drive system 14 comprises a vertical shift register 141.

FIG. 2 shows, by way of example, pixels 20 in the effective pixel area 11. Each of the pixels 20 comprises a TFT 21 as a switching element, a liquid crystal cell 22 having a pixel electrode connected to the drain electrode of the TFT 21, and an auxiliary capacitor 23 having an electrode connected to the drain electrode of the TFT 21. The TFTs 21 of the respective pixels 20 have gate electrodes connected to row lines . . . , $24m-1$, $24m$, $24m+1$, . . . as vertical selection lines, and source electrodes connected to column lines . . . , $25n-1$, $25n$, $25n+1$, . . . as signal lines.

The liquid crystal cells 22 have respective confronting electrodes connected to common lines 26 to which a common voltage VCOM is applied. The liquid crystal cells 22 are driven according to an inverted-common drive process in which the common voltage VCOM is inverted in each horizontal period. According to the inverted-common drive process, since the polarity of the common voltage VCOM is inverted in each horizontal period, the voltage of the first and second horizontal drive systems 12, 13 is lowered to reduce the power consumption by the overall liquid crystal display unit.

Operation of each of the first and second horizontal drive systems 12, 13 will be described below. While only the first horizontal drive system 12 will be described below, the description equally applies to the second horizontal drive system 13.

In the first horizontal drive system 12, horizontal transfer pulses 1, i.e., a horizontal start pulse HST1 and a horizontal clock pulse HCK1, are applied to the horizontal shift register 121. In response to the horizontal start pulse HST1, the horizontal shift register 121 performs horizontal scanning in the period of the horizontal clock pulse HCK1. The sampling and first latch circuit 122 successively samples digital data in synchronism with the horizontal scanning performed by the horizontal shift register 121, and latches the sampled data for each of the column lines . . . , $25n-1$, $25n$, $25n+1$, . . .

The second latch circuit 123 re-latches the latched data corresponding to the respective column lines which have been latched by the sampling and first latch circuit 122, in response to a latch signal given in each horizontal period. The level shifter 124 shifts the signal level (amplitude) of the latched data re-latched by the second latch circuit 22 into a given level, and supplies the level-shifted latched data to the D/A converter 125.

In the vertical drive system 14, the vertical shift register 141 is supplied with vertical transfer pulses, i.e., a vertical start pulse VST and a vertical clock pulse VCK. In response to the vertical start pulse VST, the vertical shift register 141 performs vertical scanning in the period of the vertical clock pulse VCK, thus applying a successive row selection signal for each row to the effective pixel area 11.

In the first and second horizontal drive systems 12, 13, the D/A converters 125, 135 comprise respective reference-voltage-selection-type D/A converters for selecting a desired reference voltage from as many reference voltages as the number of gradations in response to the data whose levels have been shifted by the level shifters 124, 134, and outputting the selected reference voltage to the column lines. The reference-voltage-selection-type D/A converters are employed because their output voltage suffers small variations. The present invention is concerned with the reference-voltage-selection-type D/A converter.

Figure 3:
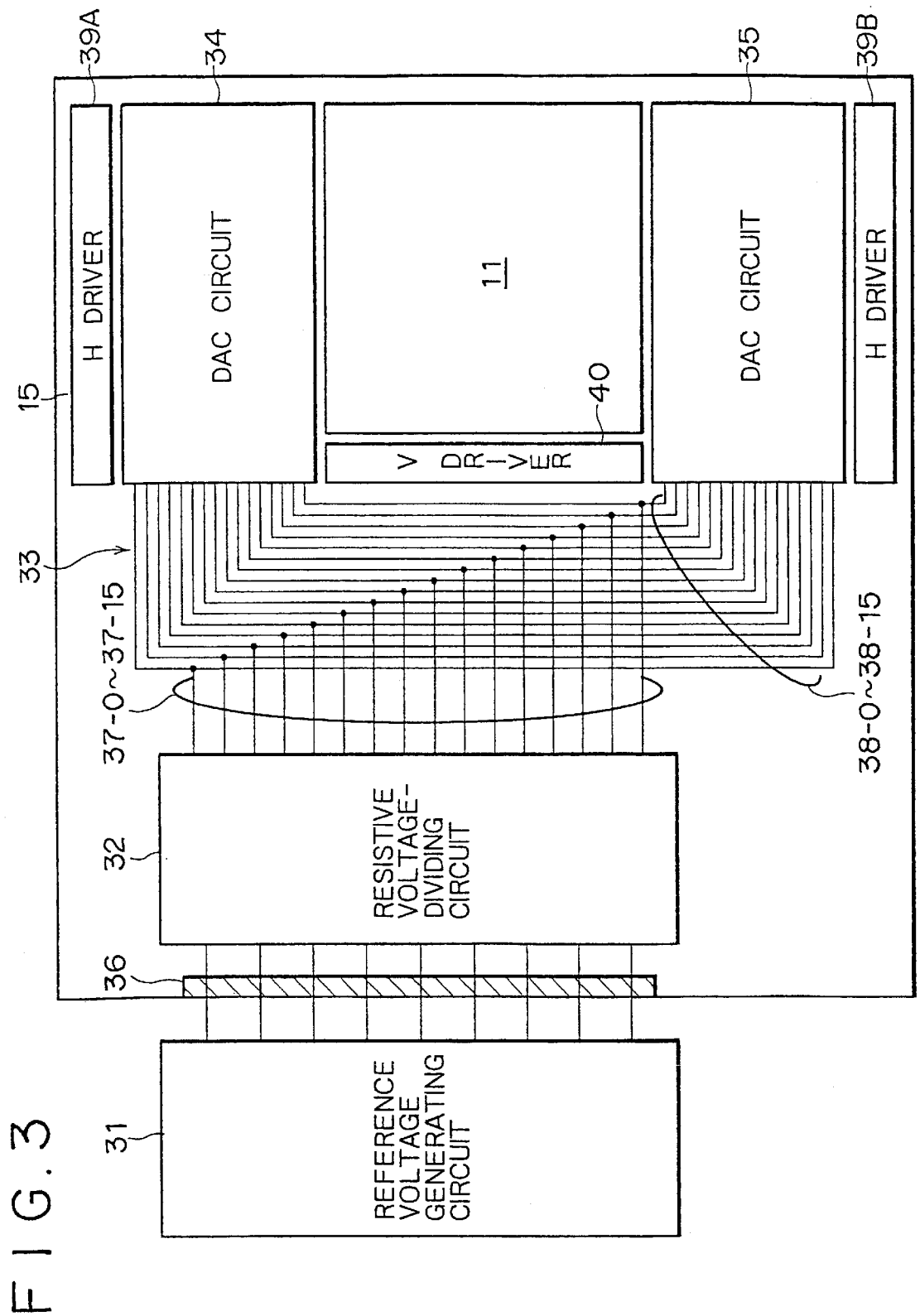
FIG. 3 is a block diagram of a basic arrangement of a reference-voltage-selection-type D/A converter.

FIG. 3 shows in block form a basic arrangement of a reference-voltage-selection-type D/A converter.

As shown in FIG. 3, the reference-voltage-selection-type D/A converter comprises a reference voltage generating circuit 31, a resistive voltage-dividing circuit 32, an interconnection pattern 33, and DAC circuits 34, 35. Only the reference voltage generating circuit 31 is constructed as an IC and disposed outside of the LCD panel 15. The resistive voltage-dividing circuit 32, the interconnection pattern 33, and the DAC circuits 34, 35 are mounted on the LCD panel 15 and disposed around the effective pixel area 11.

The reference voltage generating circuit 31 generates a plurality of reference voltages, e.g., nine reference voltages V0–V8 in this embodiment. These reference voltages V0–V8 are applied via a pad 36 of the LCD panel 15 to the resistive voltage-dividing circuit 32. The resistive voltage-dividing circuit 32 generates reference voltages Vref0–Vref15 for 16 (=$2^4$) gradations from the reference voltages V0–V8 by way of resistive voltage division. The number of these reference voltages Vref0–Vref15 corresponds to the number of gradations determined by the number of bits of digital data supplied to the DAC circuits 34, 35. In this embodiment, 16 gradations are displayed based on 4-bit digital data.

The interconnection pattern 33 serves to transmit the reference voltages Vref0–Vref15 for 16 gradations outputted from the resistive voltage-dividing circuit 32 to the DAC circuits 34, 35. The interconnection pattern 33 comprises 16 reference voltage lines 37-0–37-15 made of aluminum, for example, for extracting the reference voltages Vref0–Vref15 from the resistive voltage-dividing circuit 32, and 16 leading lines 38-0–38-15 made of aluminum, for example, for applying the reference voltages Vref0–Vref15 to the DAC circuits 34, 35.

The DAC circuits 34, 35, which correspond to the D/A converters 125, 135 shown in FIG. 1, are responsive to 4-bit digital data, for selecting a desired reference voltage from the reference voltages Vref0–Vref15 for 16 gradations supplied from the resistive voltage-dividing circuit 32 via the interconnection pattern 33, and outputting the selected reference voltage to output lines made of aluminum, for example. The output lines are connected to corresponding column lines in the effective pixel area 11.

In FIG. 3, an H driver 39A corresponds to the horizontal shift register 121, the sampling and first latch circuit 122, the second latch circuit 123, and the level shifter 124 shown in FIG. 1, and an H driver 39B corresponds to the horizontal shift register 131, the sampling and first latch circuit 132, the second latch circuit 133, and the level shifter 134 shown in FIG. 1.

The V driver 40 corresponds to the vertical shift register 141.

Various different specific circuit arrangements of each of the DAC circuits 34, 35 will be described below with reference to FIGS. 4 through 8. For the sake of brevity, it is assumed that 2-bit digital data is applied to the DAC circuits 34, 35 and hence 4 (=$2^2$) reference voltages Vref0–Vref3 are used.

Figure 4:
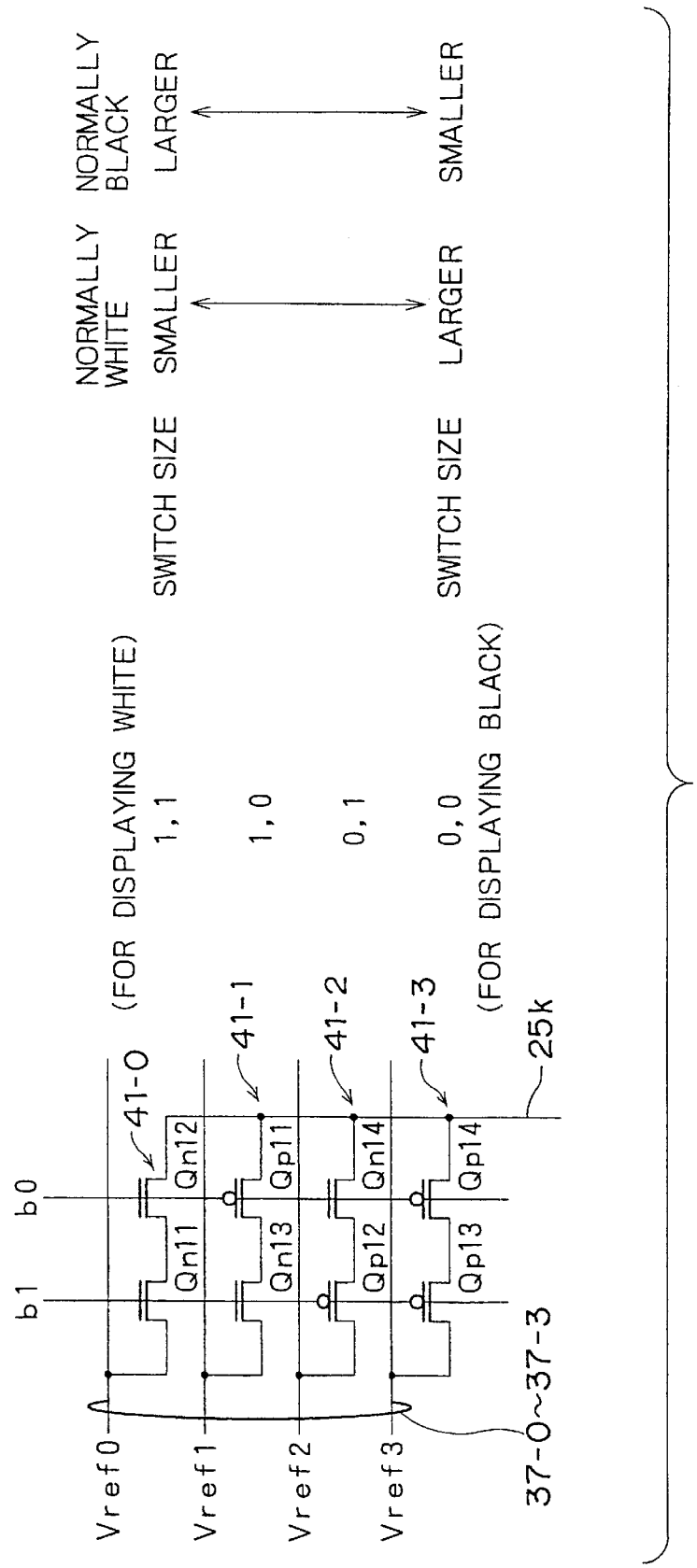
FIG. 4 is a circuit diagram of a first specific example of a DAC circuit.

FIG. 4 is a circuit diagram of a first specific example of a DAC circuit. According to the first specific example, the DAC circuit has 4 gradation selecting units 41-0–41-3 connected between reference voltage lines 37-0–37-3 for transmitting 4 reference voltages Vref0–Vref3 and a column line 25k, made of aluminum, for example, in the effective pixel area 11. The column line 25k represents any arbitrary column line in the effective pixel area 11.

The gradation selecting unit 41-0 comprises two series-connected NMOS switches Qn11, Qn12, each comprising a transistor. The gradation selecting unit 41-1 comprises an NMOS switch Qn13 and a PMOS switch Qp11, each comprising a transistor, which are connected in series with each other. The gradation selecting unit 41-2 comprises a PMOS switch Qp12 and an NMOS switch Qn14, each comprising a transistor, which are connected in series with each other. The gradation selecting unit 41-3 comprises two series-connected PMOS switches Qp13, Qp14, each comprising a transistor. A bit b1 of digital data is applied to the gates of the MOS switches in the left column in FIG. 4, and a bit b0 of digital data is applied to the gates of the MOS switches in the right column.

When the digital data represents "1, 1", the NMOS switches Qn11, Qn12 are turned on, and the gradation selecting unit 41-0 selects the reference voltage Vref0, which corresponds to the display of white. When the digital data represents "0, 0", the PMOS switches Qp13, Qp14 are turned on, and the gradation selecting unit 41-3 selects the reference voltage Vref3, which corresponds to the display of black.

When the digital data represents "1, 0", the NMOS switch Qn13 and the PMOS switch Qp11 are turned on, and the gradation selecting unit 41-1 selects the reference voltage Vref1. When the digital data represents "0, 1", the PMOS switch Qp12 and the NMOS switch Qn14 are turned on, and the gradation selecting unit 41-2 selects the reference voltage Vref2. These reference voltages Vref1, Vref2 correspond to the display of intermediate gradations between white and black.

Figure 5:
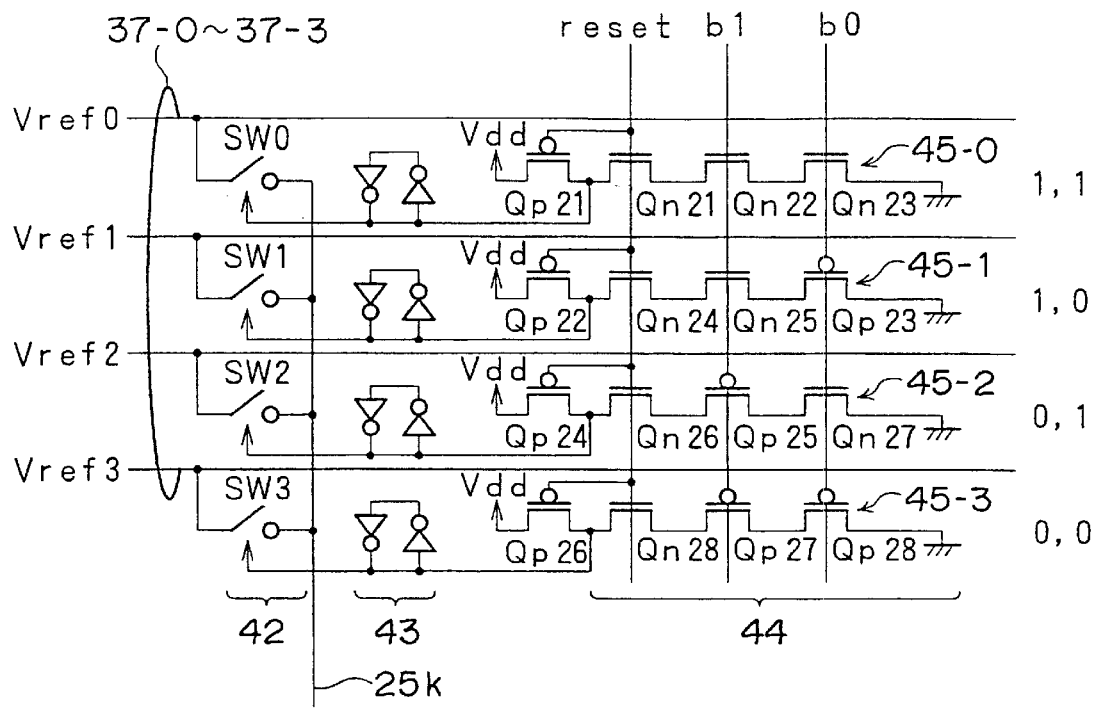
FIG. 5 is a circuit diagram of a second specific example of a DAC circuit.

FIG. 5 is a circuit diagram of a second specific example of a DAC circuit. According to the second specific example, the DAC circuit has 4 gradation selecting units 45-0–45-3 which comprise a selecting switch circuit 42, a latch circuit 43, and a decoding circuit 44, and are connected to the respective reference voltage lines 37-0–37-3 for transmitting 4 reference voltages Vref0–Vref3.

The selecting switch circuit 42 comprises switches SW0–SW3 connected between the respective reference voltage lines 37-0–37-3 and the column line 25k. Each of the switches SW0–SW3 is in the form of an electronic switch which may comprise a MOS transistor, for example.

The decoding circuit 44 comprises a PMOS switch Qp21 and NMOS switches Qn21–Qn23 which are connected in series with each other and associated with the reference voltage line 37-0 for transmitting the reference voltage Vref0, and a PMOS switch Qp22, NMOS switches Qn24, Qn25, and a PMOS switch Qp23 which are connected in series with each other and associated with the reference voltage line 37-1 for transmitting the reference voltage Vref1.

The decoding circuit 44 also comprises a PMOS switch Qp24, an NMOS switch Qn26, a PMOS switch Qp25, and an NMOS switch Qn27 which are connected in series with each other and associated with the reference voltage line 37-2 for transmitting the reference voltage Vref2, and a PMOS switch Qp26, an NMOS switch Qn28, and PMOS switches Qp27, Qp28 which are connected in series with each other and associated with the reference voltage line 37-3 for transmitting the reference voltage Vref3.

These MOS switches are connected between a power supply Vdd and GND (ground). The two PMOS and NMOS switches of the left column are paired, and a reset signal is applied to each of the gates of these PMOS and NMOS switches. A bit b1 of digital data is applied to each of the gates of the MOS switches of the middle column, and a bit b0 of digital data is applied to each of the gates of the MOS switches of the right column.

Figure 6:
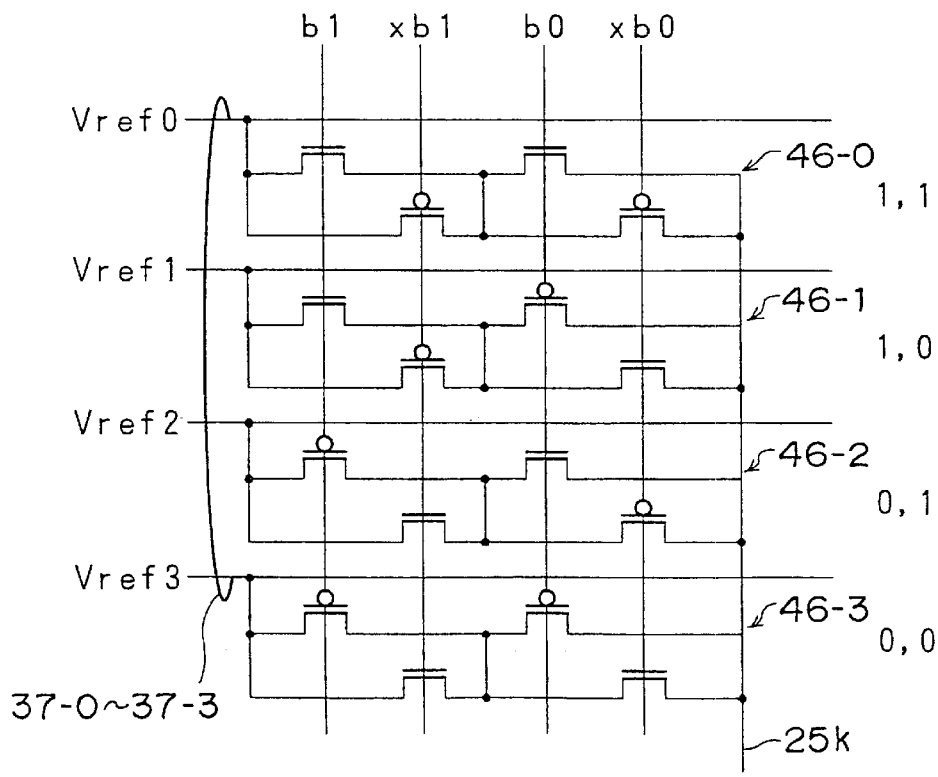
FIG. 6 is a circuit diagram of a third specific example of a DAC circuit.

FIG. 6 is a circuit diagram of a third specific example of a DAC circuit. According to the third specific example, the DAC circuit has 4 gradation selecting units 46-0–46-3 connected between the reference voltage lines 37-0–37-3 and the column line 25k. The gradation selecting units 46-0–46-3 have selecting switches each in the form of a CMOS switch.

Figure 7:
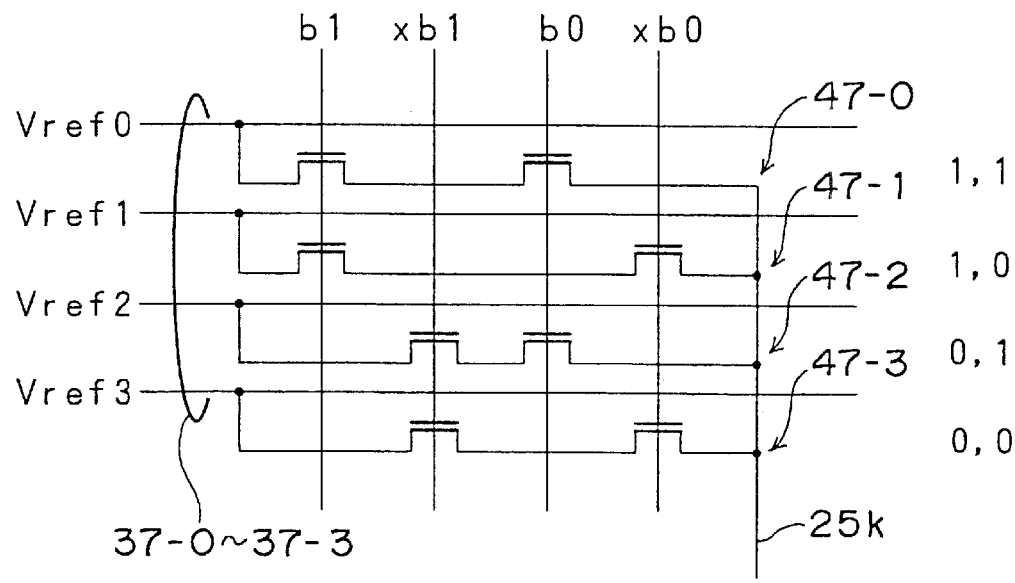
FIG. 7 is a circuit diagram of a fourth specific example of a DAC circuit.

FIG. 7 is a circuit diagram of a fourth specific example of a DAC circuit. According to the fourth specific example, the DAC circuit has 4 gradation selecting units 47-0–47-3 connected between the reference voltage lines 37-0–37-3 and the column line 25k. The gradation selecting units 47-0–47-3 have selecting switches each in the form of an NMOS switch.

Figure 8:
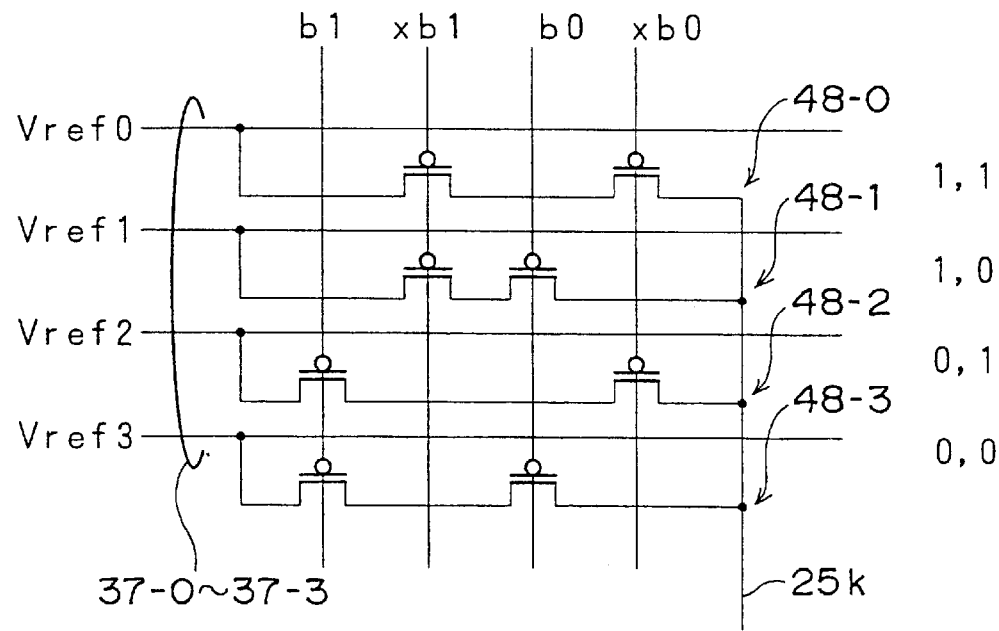
FIG. 8 is a circuit diagram of a fifth specific example of a DAC circuit.

FIG. 8 is a circuit diagram of a fifth specific example of a DAC circuit. According to the fifth specific example, the DAC circuit has 4 gradation selecting units 48-0–48-3 connected between the reference voltage lines 37-0–37-3 and the column line 25k. The gradation selecting units 48-0–48-3 have selecting switches each in the form of a PMOS switch.

The DAC circuits according to the third through fifth specific examples are modifications of the DAC circuit according to the first specific example which employ PMOS and NMOS switches as selecting switches. In the third through fifth specific examples, digital data b1, b0 and their inverted data xb1, xb0 are supplied to the gradation selecting units.

First Embodiment

According to a first embodiment, in the liquid crystal display unit with the integral drive circuit having the reference-voltage-selection-type D/A converter of the above structure, a transistor size, e.g., a channel width W, of each of the transistors of the MOS switches of the DAC circuits 34, 35 is weighted depending on the selected gradation.

The DAC circuit according to the first specific example (see FIG. 4) will be described below by way of illustrative example. In the DAC circuit, the gradation selecting units 41-0–41-3 select either one of the reference voltages Vref0–Vref3 according to a logic combination of the bits b0, b1 of digital data, and output the selected reference voltage to the column line 25k.

The on-state resistance of the MOS switches Qn, Qp in the gradation selecting unit 41 which corresponds to the selected reference voltage Vref should be sufficient to charge the load capacitance of the column line 25k in a predetermined time, i.e., one horizontal period. Therefore, the transistor size of the MOS switches Qn, Qp need to satisfy the condition of the on-state resistance thereof.

In order to satisfy the condition of the on-state resistance, it has heretofore been customary for the conventional DAC circuits to have the same transistor size for the MOS switches Qn, Qp to meet the maximum capacitance of the column line 25k. In reality, however, the load capacitance of the column line 25k differs greatly depending on the selected gradation.

For example, in a normally white display mode, the capacitance of the column line 25k for displaying white is sufficiently smaller than for displaying black. Therefore, the transistor size of the MOS switches Qn11, Qn12 which select the reference voltage Vref0 for displaying white may be smaller than the transistor size of the MOS switches Qp13, Qp14 which select the reference voltage Vref3 for displaying black.

In view of the above analysis, according to the first embodiment of the present invention, the transistor size of the MOS switches of the DAC circuits 34, 35 is weighted depending on the selected gradation. Specifically, in the normally white display mode, the channel width W of each of the transistors of the MOS switches of the gradation selecting units 41-0–41-3 is made smaller as the gradation is closer to white, and larger as the gradation is closer to black.

Figure 9:
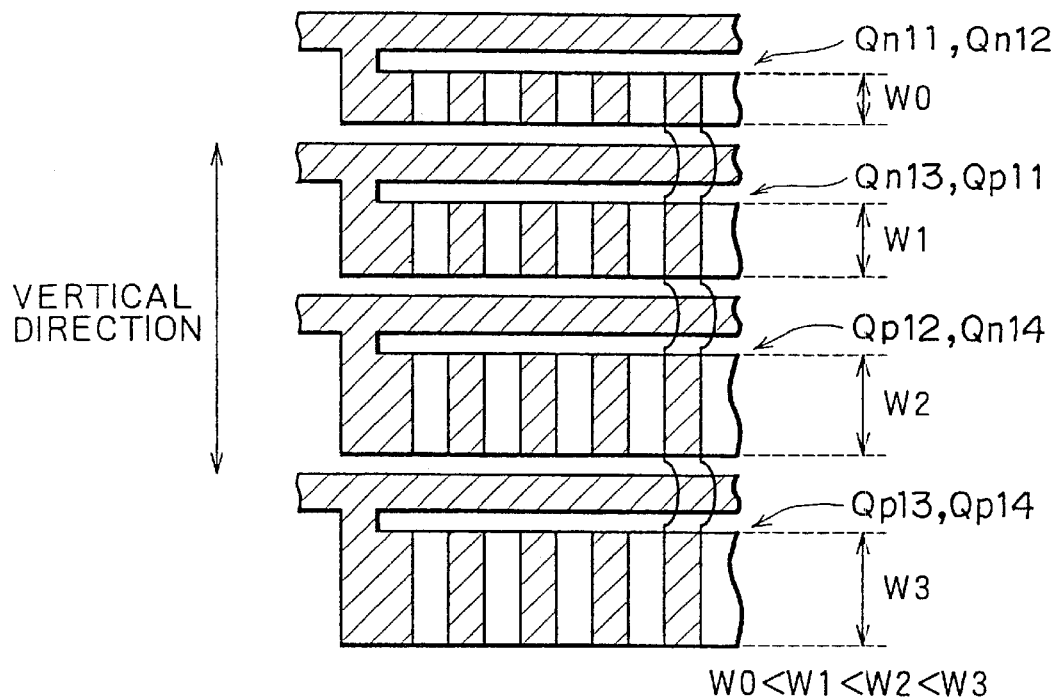
FIG. 9 is a diagram of a pattern of a DAC circuit showing a D/A converter according to a first embodiment of the present invention.

As shown in FIG. 9, the channel width of the MOS switches Qn11, Qn12 is represented by W0, the channel width of the MOS switches Qn13, Qp11 is represented by W1, the channel width of the MOS switches Qp12, Qn14 is represented by W2, and the channel width of the MOS switches Qp13, Qp14 is represented by W3. The channel width W3 is set to a size corresponding to the load capacitance for the display of black, and the other channel widths W0, W1, W2 are set to minimum sizes capable of charging the load capacitance in one horizontal period for the respective gradations.

While the weighted channel widths have been described with respect to the normally white display mode, the transistor sizes, e.g., the channel widths W of the transistors, are inversely related to the gradations in the normally black display mode.

By thus weighting the transistor size of the MOS switches depending on the selected gradation, the DAC circuits 34, 35 can be constructed more efficiently in a smaller area than the conventional DAC circuits which have been required to have the same transistor size for the MOS switches Qn, Qp to meet the maximum capacitance of the column line 25k. As a result, the frame of the LCD panel 15 can be reduced in size.

More specifically, the DAC circuits 34, 35 are disposed in the frame of the LCD panel 15 above and below the effective pixel area 11. As shown in FIG. 9, since the channel widths W of the MOS switches extend in the vertical direction, the DAC circuits 34, 35 can be reduced in area in the vertical direction of the LCD panel 15. Therefore, the vertical size (width) of the frame of the LCD panel 15, particularly above and below the effective pixel area 11, can be reduced.

In this embodiment, the DAC circuit according to the first specific example has been described for use as the DAC circuits 34, 35. If the DAC circuits according to the second through fifth specific examples are employed, then the transistor size of the MOS switches of the gradation selecting units of those DAC circuits may also be weighted depending on the selected gradation.

Second Embodiment

According to a second embodiment, in the liquid crystal display unit with the integral drive circuit having the reference-voltage-selection-type D/A converter shown in FIG. 3, a line width of the interconnection pattern 33, particularly, the leading lines 38-0–38-3 is weighted depending on the selected gradation.

As described above in the first embodiment, in the DAC circuits 34, 35, the gradation selecting units select either one of the reference voltages Vref0–Vref3 according to a logic combination of the bits b0, b1 of digital data, and output the selected reference voltage to the column line 25k. At this time, the load capacitance of the column line 25k differs depending on the displayed gradation.

In the conventional reference-voltage-selection-type D/A converter, the reference voltage lines 37-0–37-3 and the leading lines 38-0–38-3, which are made of Mo—Ta, for example, in the interconnection pattern 33 have been designed to have the same line width to meet the maximum capacitance of the column line 25k.

According to the second embodiment, as shown in FIG. 3, the line width of the leading lines 38-0–38-3, made of aluminum, for example, which extend to the DAC circuits 34, 35 is weighted depending on the selected gradation. Specifically, in the normally white display mode in the circuit shown in FIG. 4, the line width of the leading lines 38-0–38-3 is made smaller as the gradation is closer to white, and larger as the gradation is closer to black.

Figure 10:
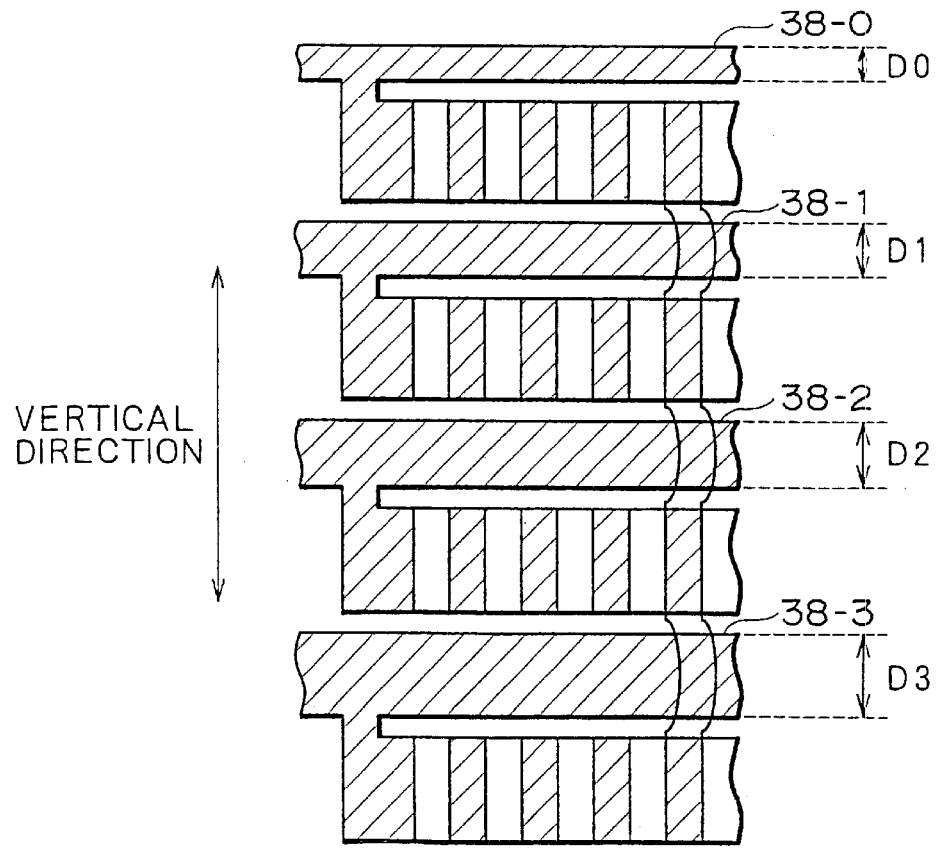
FIG. 10 is a diagram of a pattern of a DAC circuit showing a D/A converter according to a second embodiment of the present invention.

As shown in FIG. 10, the line width of the leading line 38-0 for transmitting the reference voltage Vref0 is represented by D0, the line width of the leading line 38-1 for transmitting the reference voltage Vref1 is represented by D1, the line width of the leading line 38-2 for transmitting the reference voltage Vref2 is represented by D2, and the line width of the leading line 38-3 for transmitting the reference voltage Vref3 is represented by D3. The line width D3 of the leading line 38-3 is set to a size corresponding to the load capacitance for the display of black, and the other line widths D0, D1, D2 of the leading lines 38-0, 38-1, 38-2 are set to sizes that satisfy the relationship: D0<D1<D2<D3.

While the weighted line widths have been described with respect to the normally white display mode, the line widths of the leading lines 38-0–38-3 are inversely related to the gradations in the normally black display mode. Specifically, in the normally black display mode, the line width of the leading lines 38-0–38-3 is made larger as the gradation is closer to white, and smaller as the gradation is closer to black.

By thus weighting the line widths of the leading lines 38-0–38-3 depending on the selected gradation, the line widths of the leading lines 38-0–38-3 can be smaller than with the conventional DAC circuits which have been required to have the same line width for the leading lines 38-0–38-3 to meet the maximum capacitance of the column line 25k. As a result, the frame of the LCD panel 15 can be reduced in size.

More specifically, as shown in FIG. 3, the leading lines 38-0–38-3 of the interconnection pattern 33 extend to the DAC circuits 34, 35 positioned above and below the effective pixel display area 11 on the LCD panel 15, and extend horizontally parallel to each other in the DAC circuits 34, 35. Since the line widths of the leading lines 38-0–38-3 are reduced, the vertical size (width) of the frame of the LCD panel 15, particularly above and below the effective pixel area 11, can be reduced.

The present embodiment has been described as being applied to the reference-voltage-selection-type D/A converter in which the resistive voltage-dividing circuit 32 is mounted on the LCD panel 15 and as many reference voltages as the number of gradations are outputted from the resistive voltage-dividing circuit 32 and transmitted to the DAC circuits 34, 35 via the leading lines. However, the present embodiment is also applicable to a D/A converter in which as many reference voltages as the number of gradations are directly supplied from the external reference voltage generating circuit 31 and transmitted to the DAC circuits 34, 35 via the leading lines.

Third Embodiment

According to a third embodiment, in the liquid crystal display unit with the integral drive circuit having the reference-voltage-selection-type D/A converter which has the resistive voltage-dividing circuit 32 mounted on the LCD panel 15 as shown in FIG. 3, a line width of the leading lines for outputting reference voltages from an external source without passing through voltage-dividing resistors in the resistive voltage-dividing circuit 32 and a line width of the leading lines for outputting reference voltages from an external source via voltage-dividing resistors in the resistive voltage-dividing circuit 32 are different from each other.

Figure 11:
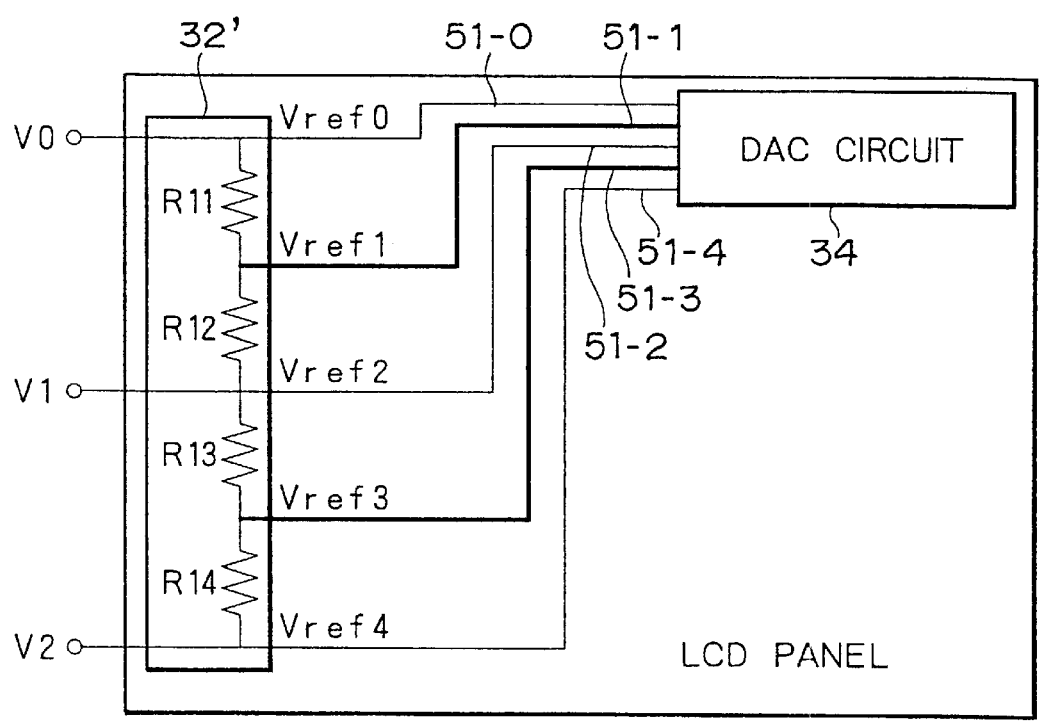
FIG. 11 is a diagram of a pattern of an interconnection pattern showing a D/A converter according to a third embodiment of the present invention.

FIG. 11 shows, by way of example, an arrangement in which three reference voltages V0, V1, V2 are supplied from an external source outside of the LCD panel 15 and a resistive voltage-dividing circuit 32' produces five reference voltages Vref0–Vref4 from the reference voltages V0, V1, V2 by way of resistive voltage division. For the sake of brevity, only the upper DAC circuit 34 is shown in FIG. 11.

In FIG. 11, the resistive voltage-dividing circuit 32' comprises two voltage-dividing resistors R11, R12 for dividing the difference between the reference voltages V0, V1 to produce the reference voltage Vref1, and two voltage-dividing resistors R13, R14 for dividing the difference between the reference voltages V1, V2 to produce the reference voltage Vref3. The voltage-dividing resistors can be produced by changing the dose of an impurity in polysilicon or changing the line width of a resistor.

The reference voltages V0, V1, V2 serve as the reference voltages Vref0, Vref2, Vref4, respectively, and are transmitted to the DAC circuit 34 by respective leading lines 51-0, 51-2, 51-4. The reference voltages Vref1, Vref3 produced by the voltage-dividing resistors R11, R12, R13, R14 are transmitted to the DAC circuit 34 by respective leading lines 51-1, 51-3.

The resistances of the leading lines 51-0–51-4 are determined by their line widths. The line widths of the leading lines 51-0–51-4 are set to meet the capacitance of the column line for the display of black.

If the leading lines 51-0, 51-2, 51-4 for transmitting the reference voltages Vref0, Vref2, Vref4 and the leading lines 51-1, 51-3 for transmitting the reference voltages Vref1, Vref3 have the same line width, then the leading lines 51-0, 51-2, 51-4 pose a smaller resistance than the leading lines 51-1, 51-3 because no voltage-dividing resistors are involved in the leading lines 51-0, 51-2, 51-4.

In the present embodiment, the line widths of the leading lines 51-1, 51-3 for transmitting the reference voltages via the voltage-dividing resistors are set to meet the capacitance of the column line for the display of black, and the resistance of the leading lines 51-0, 51-2, 51-4 can be higher as no voltage-dividing resistors are involved therein. Therefore, the line widths of the leading lines 51-0, 51-2, 51-4 are made smaller than the line widths of the leading lines 51-1, 51-3. In this manner, the resistance of the leading lines 51-0, 51-2, 51-4 can be brought closer to the resistance of the leading lines 51-1, 51-3.

By making the line widths of the leading lines 51-0, 51-2, 51-4 for outputting the reference voltages Vref0, Vref2, Vref4 from the external source without passing through the voltage-dividing resistors in the resistive voltage-dividing circuit 32', different from the line widths of the leading lines 51-1, 51-3 for outputting the reference voltages Vref1, Vref3 from the external source via the voltage-dividing resistors in the resistive voltage-dividing circuit 32', the total line width of the leading lines 51-0–51-4 can be made smaller than with the conventional DAC circuits which have been required to have the same line width for the leading lines to meet the capacitance of the column line for the display of black. As a result, the frame of the LCD panel 15 can be reduced in size.

In the present embodiment, the line widths of the leading lines for transmitting the reference voltages from the external source without passing through the voltage-dividing resistors in the resistive voltage-dividing circuit and the line widths of the leading lines for transmitting the reference voltages from the external source via the voltage-dividing resistors in the resistive voltage-dividing circuit are different from each other. Such an arrangement can be combined with the arrangement according to the second embodiment. That is, the line widths of these different types of leading lines may be made different from each other, and may be weighted depending on the selected gradation. Such a modification is effective to further reduce the total line width of the leading lines, so that the frame of the LCD panel 15 can be further reduced in size.

The arrangement according to the third embodiment may be combined with the arrangement according to the first embodiment. Specifically, the transistor sizes of the MOS switches of the DAC circuits 34, 35 are weighted depending on the selected gradation, and the line widths of the leading lines for transmitting the reference voltages from the external source without passing through the voltage-dividing resistors in the resistive voltage-dividing circuit and the line widths of the leading lines for transmitting the reference voltages from the external source via the voltage-dividing resistors in the resistive voltage-dividing circuit are different from each other and further weighted depending on the selected gradation.

Advantages offered by the arrangement in which the transistor sizes of the MOS switches are weighted depending on the selected gradation and the line widths of these different types of leading lines are made different from each other will be described below in comparison with the conventional arrangement. It is assumed that 16 gradations are displayed in the normally black display mode.

According to the conventional arrangement, all the transistor sizes of the MOS switches are the same as each other to meet the maximum capacitance of the column line, and the reference voltage lines and the leading lines are of the same line width as each other. For example, as shown in FIG. 12A, if the reference voltage lines have a line width of 65 µm and the transistors have a channel width W of 110 µm, then the total line width for the 16 gradations is 1040 µm and the total channel width W is 1760 µm, so that the DAC circuit has a width of 2800 µm in the frame.

According to the inventive arrangement, as shown in FIG. 12B, the line widths of the leading lines for transmitting the reference voltages from the external source without passing through the voltage-dividing resistors in the resistive voltage-dividing circuit are set to 40 µm, and the line widths of the leading lines for transmitting the reference voltages from the external source via the voltage-dividing resistors in the resistive voltage-dividing circuit are set to 65 µm. The channel widths W of the MOS switches for handling the reference voltage Vref0 (black) and the reference voltage Vref1 are set to 90 µm, the channel widths W of the MOS switches for handling the reference voltage Vref2–Vref13 are set to 80 µm, and the channel widths W of the MOS switches for handling the reference voltage Vref14 and the reference voltage Vref15 (white) are set to 110 µm.

With the inventive arrangement, the total line width for the 16 gradations is 840 µm and the total channel width W is 1360 µm, so that the DAC circuit has a width of 2200 µm in the frame. Consequently, the inventive arrangement shown in FIG. 12B can makes the frame smaller than the conventional arrangement shown in FIG. 12A by 600 (=2800−2200) µm.

Figure 13:
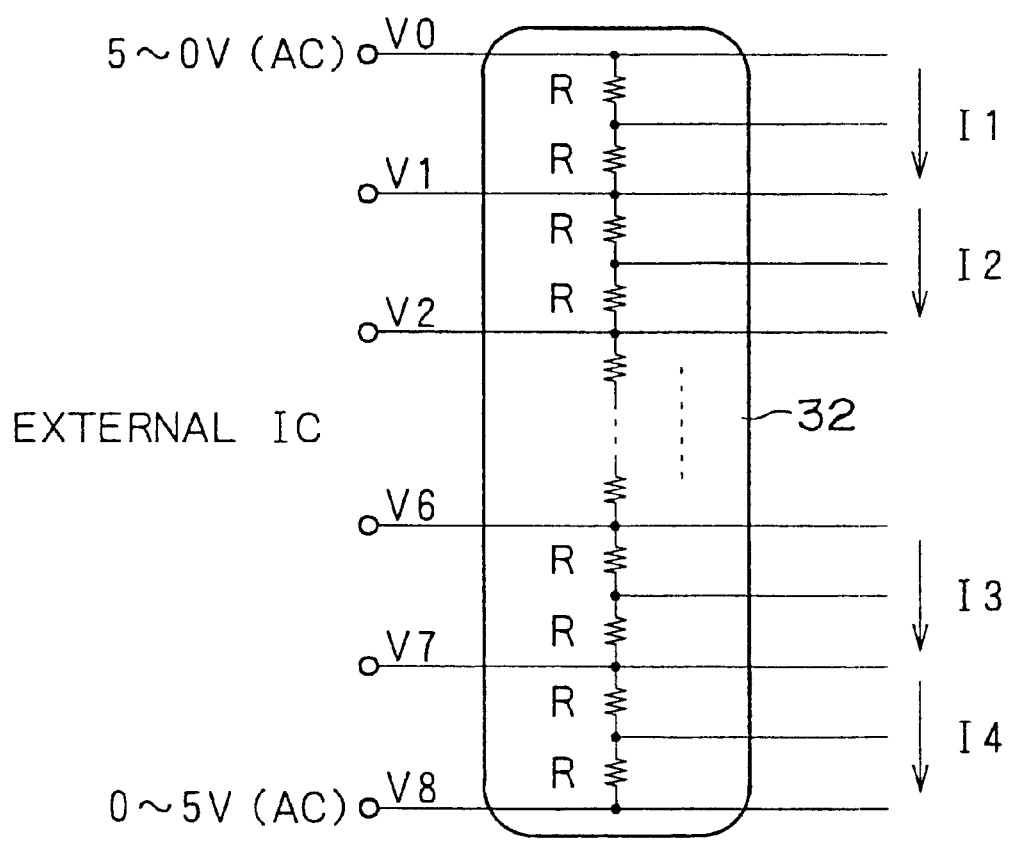
FIG. 13 is a circuit diagram of a conventional resistive voltage-dividing circuit.

As shown in FIG. 13, the resistive voltage-dividing circuit 32 shown in FIG. 3 is of a circuit arrangement for dividing the 9 reference voltages V0–V8 outputted from the external reference voltage generating circuit 31 with voltage-dividing resistors having the same resistance R for achieving a multiplicity of gradations. In the circuit arrangement shown in FIG. 13, since different potentials are applied between the reference voltage lines connected directly to the external reference voltage generating circuit 31, direct currents I1, I2, . . . flow through the voltage-dividing resistors.

Figure 14:
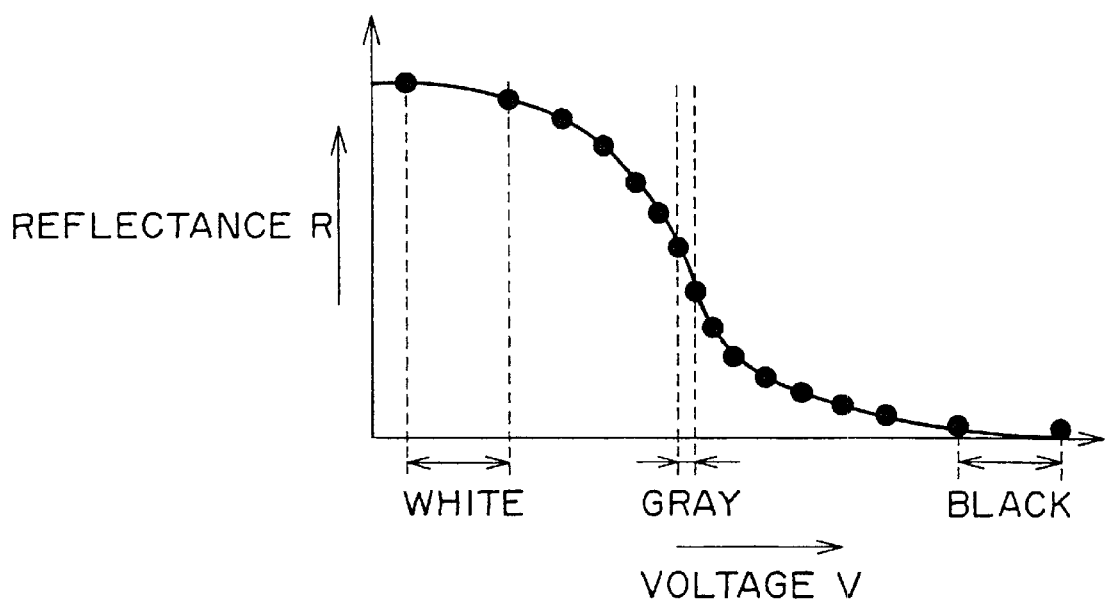
FIG. 14 is a diagram showing the V-R characteristics (gamma characteristics) of a liquid crystal.

For example, it is assumed that there is a potential difference of 5 V between the reference voltage line for the display of white and the reference voltage line for the display of black. If direct currents flowing between the reference voltage lines have different values, then a large current flows into the external reference voltage generating circuit 31. Furthermore, as shown in FIG. 14, the gamma characteristics of a liquid crystal display unit, i.e., the V-R characteristics representing the relationship between a voltage V applied to the liquid crystal and a reflectance R thereof, are such that the difference between values of voltage V applied to the liquid crystal need to be large in order to develop appreciable gradations in displayed regions of white and black, and it is difficult to express gradations in multigradation display.

Fourth Embodiment

According to a fourth embodiment, in the liquid crystal display unit with the integral drive circuit having the reference-voltage-selection-type D/A converter which has the resistive voltage-dividing circuit 32 mounted on the LCD panel 15 as shown in FIG. 3, the resistances of the voltage-dividing resistors of the resistive voltage-dividing circuit 32 are weighted depending on the selected gradation.

Figure 15:
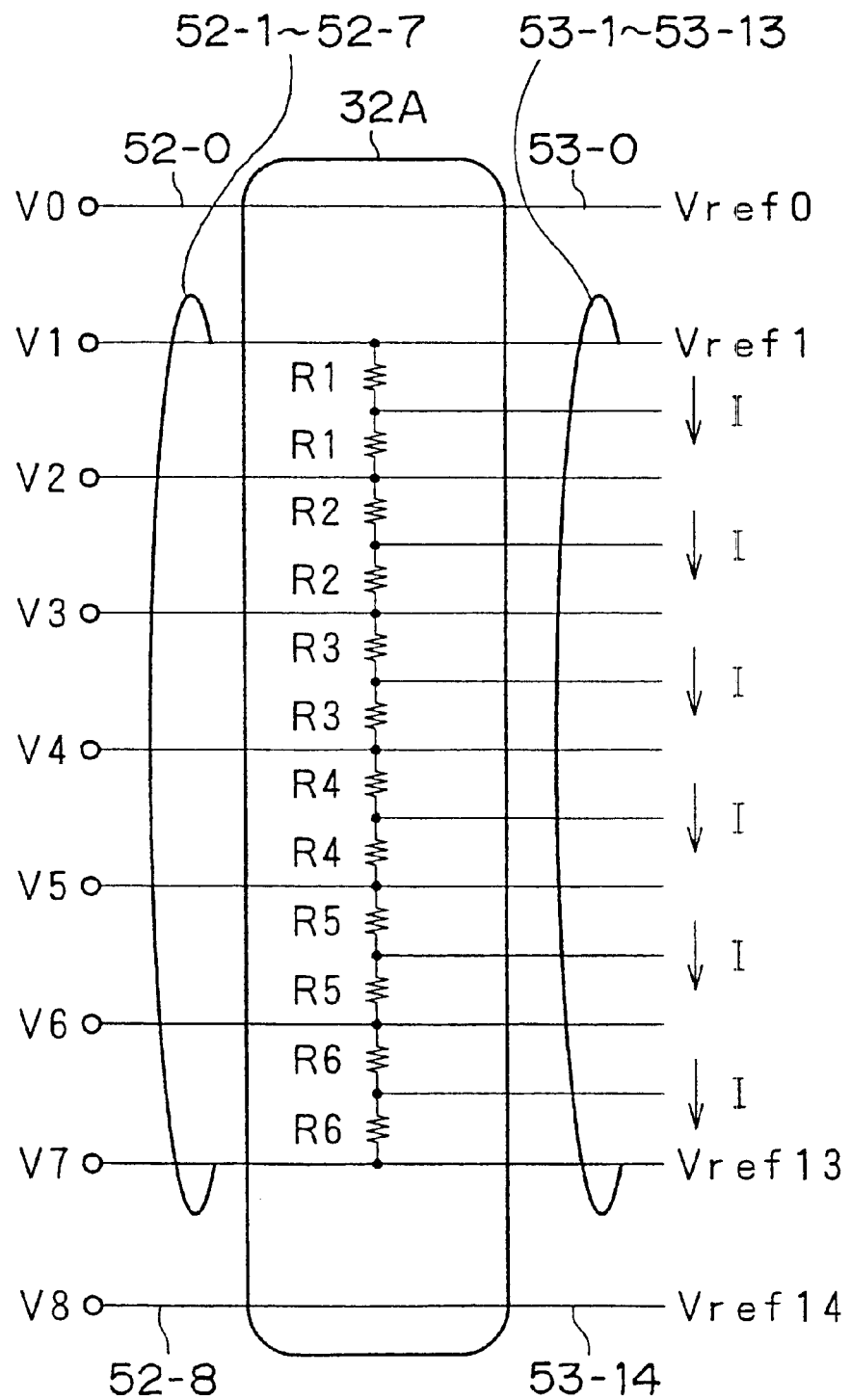
FIG. 15 is a circuit diagram of a resistive voltage-dividing circuit of a D/A converter according to a fourth embodiment of the present invention.

Specifically, as described above, the potential difference between reference voltages of adjacent gradations need to be large in order to develop appreciable gradations in displayed regions of white and black. For this reason, as shown in FIG. 15, of supply lines 52-0–52-8 for supplying the reference voltages V0–V8 from the external reference voltage generating circuit 31, the supply line 52-0 for the display of black and the supply line 52-8 for the display of white are not connected to voltage-dividing resistors in a resistive voltage-dividing circuit 32A, but are connected to reference voltage lines 53-0, 53-14 for directly outputting reference voltages Vref0, Vref14.

Between the supply lines 52-1–52-7 for supplying the respective reference voltages V1–V7, there are connected voltage-dividing resistors whose resistances are made different depending on the gradation. The reference voltages V1, V2, V3, V4, V5, V6, V7 are outputted directly as reference voltages Vref1, Vref3, Vref5, Vref7, Vref9, Vref11, Vref13 via respective reference voltage lines 53-1, 53-3, 53-5, 53-7, 53-9, 53-11, 53-13, and reference voltages Vref2, Vref4, Vref6, Vref8, Vref12 produced by resistive voltage division are outputted via respective reference voltage lines 53-2, 53-4, 53-6, 53-8, 53-10.

If the voltage-dividing resistors that are paired between the supply lines (reference voltage lines) 52-1–52-7 have resistances R1, R2, R3, R4, R5, R6, then these resistances are optimized to pass a constant current through the voltage-dividing resistors. As seen from the V-R characteristics shown in FIG. 14, since the potential differences between the reference voltages V1–V2, V2–V3, . . . , V6–V7 are all different from each other, the resistances of the voltage-dividing resistors are set to different values.

As described above, the reference voltage line 53-0 (the supply line 52-0) for the display of black and the reference voltage line 53-14 (the supply line 52-8) for the display of white are not connected to voltage-dividing resisters, but are independent of voltage-dividing resisters. Therefore, the potential difference between the reference voltage line 53-0 for the display of black and the reference voltage line 53-1 for the display of an adjacent gradation, and the potential difference between the reference voltage line 53-14 for the display of white and the reference voltage line 53-13 for the display of an adjacent gradation are made large enough to facilitate the expression of gradations.

The resistances of the voltage-dividing resistors are optimized to prevent a direct current from flowing in a region where there is a large potential difference between reference voltages, i.e., between reference voltage lines for black and white gradations and adjacent gradations, and to allow a certain current between other reference voltage lines. According to a total direct current flowing through the voltage-dividing resistors is minimized to achieve a reduced power requirement for an LCD module including the external reference voltage generating circuit 31.

In the present embodiment, the resistances of the voltage-dividing resistors between the supply lines 52-1–52-7 for supplying the reference voltages V1–V7 are made all different from each other depending on the gamma characteristics (V-R characteristics) of the liquid crystal. However, the resistances of the voltage-dividing resistors may be made equal to each other, and the reference voltage line 53-0 for the display of black and the reference voltage line 53-14 for the display of white may not be connected to, but may be independent of, voltage-dividing resistors, for achieving a reduced power requirement.

Since the reference voltage line 53-0 for the display of black and the reference voltage line 53-14 for the display of white are not connected to, but are independent of, voltage-dividing resistors, no resistive elements are interposed between those reference voltage lines and the reference voltages lines for adjacent gradations. since there is an infinitely large resistance therebetween, the resistances between the reference voltage line 53-0 for the display of black and the reference voltage line 53-14 for the display of white, and reference voltages lines for adjacent gradations may be considered as being set depending on the gamma characteristics (V-R characteristics) of the liquid crystal.

Figure 16:
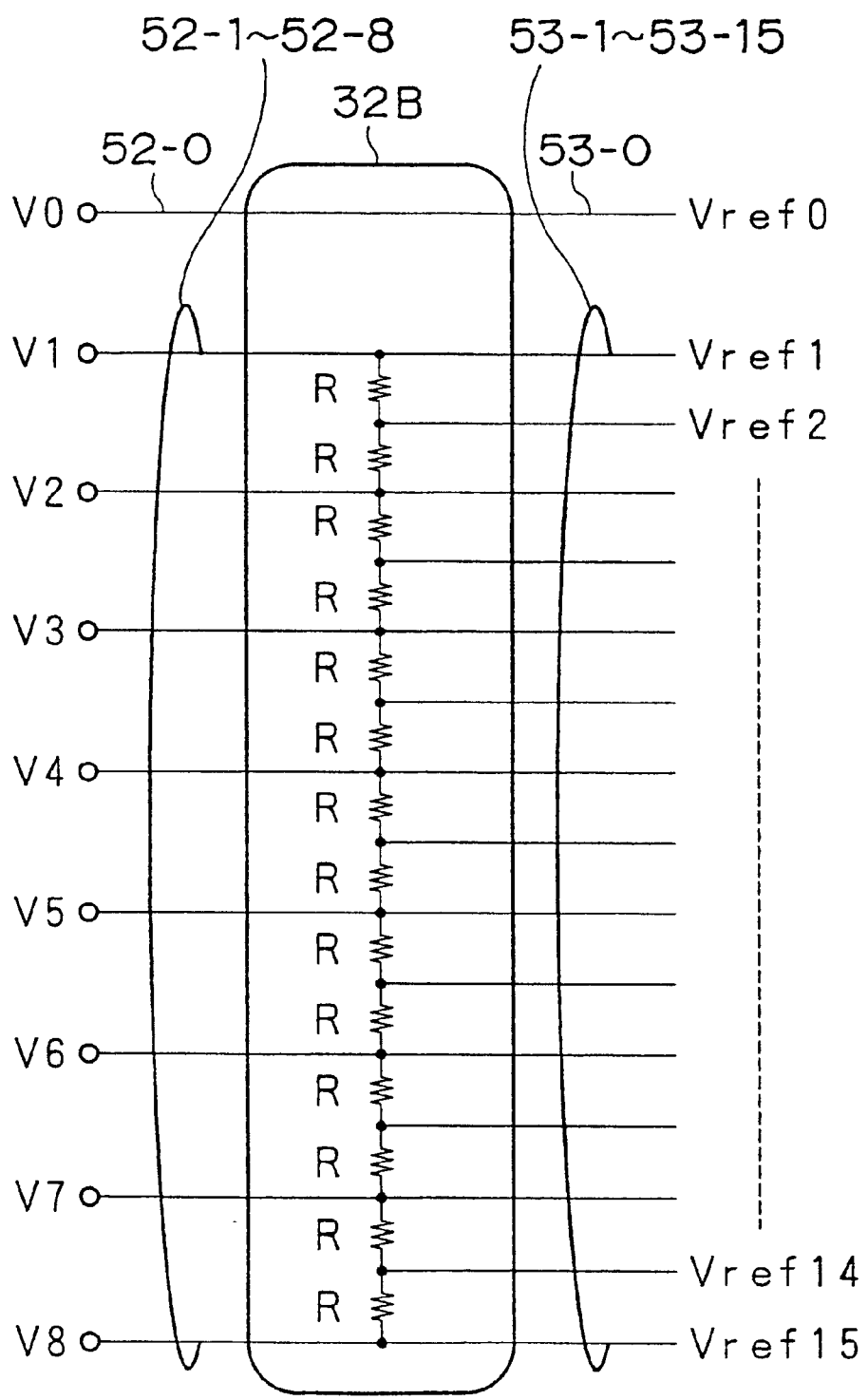
FIG. 16 is a circuit diagram of a modification of the resistive voltage-dividing circuit according to the fourth embodiment of the present invention.
Figure 17:
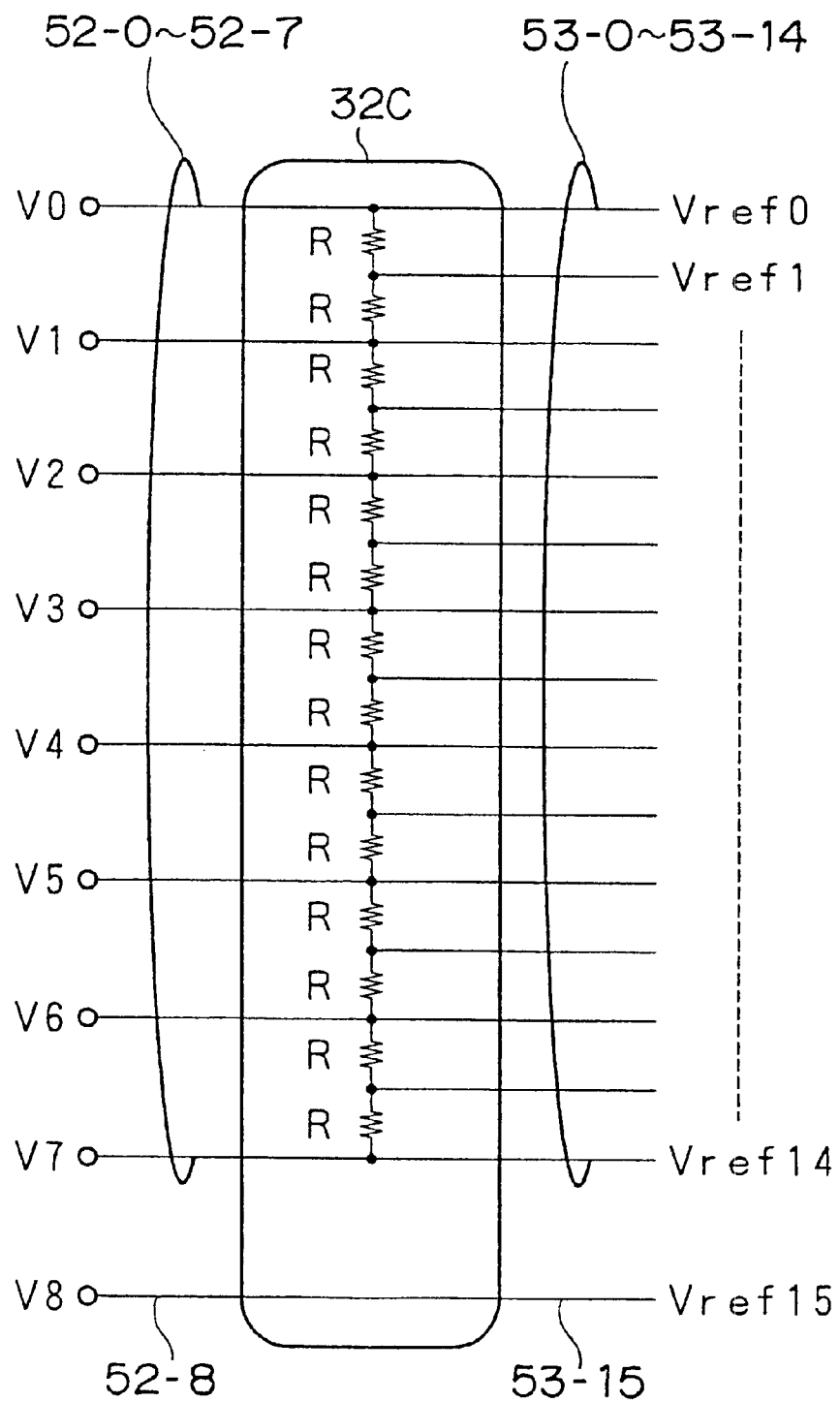
FIG. 17 is a circuit diagram of another modification of the resistive voltage-dividing circuit according to the fourth embodiment of the present invention.

In the resistive voltage-dividing circuit 32A shown in FIG. 15, the reference voltage line 53-0 for the display of black and the reference voltage line 53-14 for the display of white are not connected to, but are independent of, voltage-dividing resistors. However, as shown in FIG. 16, a resistive voltage-dividing circuit 32B may be employed in which only the reference voltage line 53-0 for the display of black is not connected to, but is independent of, voltage-dividing resistors. Alternatively, as shown in FIG. 17, a resistive voltage-dividing circuit 32C may be employed in which only the reference voltage line 53-15 for the display of white is not connected to, but is independent of, voltage-dividing resistors.

The circuit arrangement shown in FIG. 16 is effective to reduce a direct current for the display of a black gradation for thereby achieving a reduced power requirement. The circuit arrangement shown in FIG. 17 is effective to achieve a reduced power requirement as it is possible to reduce a direct current in the same manner as for the display of a black gradation. The circuit arrangement shown in FIG. 17 greatly contributes to reduced power requirement because no unwanted current needs to flow when signals for other gradations are turned off, as when only the display of a white gradation is used to display a power saving message.

In the above embodiments, the present invention is applied to the liquid crystal display unit. However, the principles of the present invention are also applicable to general display units including EL (electroluminescent) display units where EL elements are used as pixel display elements. The reference-voltage-selection-type D/A converter according to the present invention is effective to reduce the size of the frame of the display panel when mounted on the display panel. However, the D/A converter alone is advantageous in that its circuit scale including an interconnection pattern can be reduced. The polysilicon TFTs can be produced by solid-phase growth or laser recrystallization.

According to the present invention, as described above, in the reference-voltage-selection-type D/A converter, the transistor sizes of the transistor switches are made different from each other depending on the selected gradation, or the line widths of the reference voltage lines are made different from each other depending on the selected gradation, for thereby reducing the structure of transistors or reducing the total line width of as many reference voltage lines as the number of gradations. Thus, the circuit scale can be reduced. The display unit which has the D/A converter as a peripheral circuit around the pixel assembly on the display panel can have the frame of the display panel reduced in size, and can achieve the display of a multiplicity of gradations.

Moreover, in the reference-voltage-selection-type D/A converter, the resistances of the voltage-dividing resistors are made different from each other depending on the selected gradation, or the reference voltage for a particular gradation, of a plurality of reference voltages supplied from an external source is directly outputted as one of as many reference voltages as the number of gradations. Thus, direct currents flowing through the voltage-dividing resistors are reduced for thereby achieving a reduced power requirement. The display unit with the D/A converter mounted as a peripheral circuit around the pixel assembly can achieve overall low system power requirement.

Although certain preferred embodiments of the present invention have been shown and described in detail, it should be understood that various changes and modifications may be made therein without departing from the scope of the appended claim.

What is claimed is:

1. A digital-to-analog converter comprising:
   reference voltage generating means for generating $2^n$ reference voltages corresponding to n-bit (n is an integer of 2 or greater) digital data;
   $2^n$ reference voltage lines for transmitting the $2^n$ reference voltages, respectively, generated by said reference voltage generating means; and
   $2^n$ gradation selecting units connected between said $2^n$ reference voltage lines and an output line, for operation depending on a logic state of each of bits of said digital data, said $2^n$ gradation selecting units comprising transistor switches which have different transistor sizes depending on a selected gradation.

2. A digital-to-analog converter according to claim 1, wherein said $2^n$ gradation selecting units have as many transistor switches as the number of bits of said digital data connected between said $2^n$ reference voltage lines and said output line.

3. A digital-to-analog converter comprising:
   reference voltage generating means for generating $2^n$ reference voltages corresponding to n-bit (n is an integer of 2 or greater) digital data;
   $2^n$ reference voltage lines for transmitting the $2^n$ reference voltages, respectively, generated by said reference voltage generating means, said $2^n$ reference voltage lines having different line widths depending on a selected gradation; and
   a gradation selecting circuit for selecting and outputting one of said $2^n$ reference voltages transmitted by said $2^n$ reference voltage lines, depending on a logic state of each of bits of said digital data.

4. A digital-to-analog converter comprising:
   reference voltage generating means for generating a plurality of reference voltages;
   resistive voltage-dividing means for generating $2^n$ reference voltages corresponding to n-bit (n is an integer of 2 or greater) digital data based on said reference voltages generated by said reference voltage generating means by way of resistive voltage division; and a gradation selecting circuit for selecting and outputting one of said $2^n$ reference voltages supplied from said resistive voltage-dividing means, depending on a logic state of each of bits of said digital data, said resistive voltage-dividing means having voltage-dividing resistors having different resistances depending on a selected gradation, the potential difference between reference voltages for the display of adjacent gradations being large enough to facilitate the expressions of the gradations.

5. A digital-to-analog converter comprising:

reference voltage generating means for generating a plurality of reference voltages;

resistive voltage-dividing means for generating $2^n$ reference voltages corresponding to n-bit (n is an integer of 2 or greater) digital data based on said reference voltages generated by said reference voltage generating means by way of resistive voltage division, and directly outputting the reference voltage for a particular gradation supplied from said reference voltage generating means as one of said $2^n$ reference voltages; and a gradation selecting circuit for selecting and outputting one of said $2^n$ reference voltages supplied from said resistive voltage-dividing means, depending on a logic state of each of bits of said digital data.

6. A digital-to-analog converter according to claim 5, wherein said resistive voltage-dividing means has voltage-dividing resistors having different resistances depending on a selected gradation.

7. A display unit comprising a pixel assembly having a matrix of pixels, a digital-to-analog converter for converting n-bit (n is an integer of 2 or greater) digital data into an analog signal, and a drive circuit for driving the pixels of said pixel assembly with said analog signal, said digital-to-analog converter comprising:

reference voltage generating means for generating $2^n$ reference voltages;

$2^n$ reference voltage lines for transmitting the $2^n$ reference voltages, respectively, generated by said reference voltage generating means; and $2^n$ gradation selecting units connected between said $2^n$ reference voltage lines and an output line, for operation depending on a logic state of each of bits of said digital data, said $2^n$ gradation selecting units comprising transistor switches which have different transistor sizes depending on a selected gradation.

8. A display unit according to claim 7, wherein said drive circuit comprises means for writing signals in the pixels of said pixel assembly in a line-sequential manner in each horizontal period.

9. A display unit according to claim 7, wherein said drive circuit is integrally formed with said pixel assembly on one substrate.

10. A display unit according to claim 7, wherein each of the pixels of said pixel assembly comprises a liquid crystal cell.

11. A display unit according to claim 10, wherein said drive circuit comprises means for driving the pixels of said pixel assembly in an inverted-common drive process in which a common voltage applied commonly to confronting electrodes of the liquid crystal cells is inverted in each horizontal period.

12. A display unit according to claim 7, wherein each of the pixels of said pixel assembly comprises an electroluminescent element.

13. A display unit comprising a pixel assembly having a matrix of pixels, a digital-to-analog converter for converting n-bit (n is an integer of 2 or greater) digital data into an analog signal, and a drive circuit for driving the pixels of said pixel assembly with said analog signal, said digital-to-analog converter comprising:

reference voltage generating means for generating $2^n$ reference voltages;

$2^n$ reference voltage lines for transmitting the $2^n$ reference voltages, respectively, generated by said reference voltage generating means, said $2^n$ reference voltage lines having different line widths depending on a selected gradation; and a gradation selecting circuit for selecting and outputting one of said $2^n$ reference voltages transmitted by said $2^n$ reference voltage lines, depending on a logic state of each of bits of said digital data.

14. A display unit according to claim 13, wherein said drive circuit comprises means for writing signals in the pixels of said pixel assembly in a line-sequential manner in each horizontal period.

15. A display unit according to claim 13, wherein said drive circuit is integrally formed with said pixel assembly on one substrate.

16. A display unit according to claim 13, wherein each of the pixels of said pixel assembly comprises a liquid crystal cell.

17. A display unit according to claim 16, wherein said drive circuit comprises means for driving the pixels of said pixel assembly in an inverted-common drive process in which a common voltage applied commonly to confronting electrodes of the liquid crystal cells is inverted in each horizontal period.

18. A display unit according to claim 13, wherein each of the pixels of said pixel assembly comprises an electroluminescent element.

19. A display unit comprising a pixel assembly having a matrix of pixels, a digital-to-analog converter for converting n-bit (n is an integer of 2 or greater) digital data into an analog signal, and a drive circuit for dividing the pixels of said pixel assembly with said analog signal, said digital-to-analog converter comprising:

reference voltage generating means for generating a plurality of reference voltages;

resistive voltage-dividing means for generating $2^n$ reference voltages corresponding to n-bit (n is an integer of 2 or greater) digital data based on said reference voltages generated by said reference voltage generating means by way of resistive voltage division; and a gradation selecting circuit for selecting and outputting one of said $2^n$ reference voltages supplied from said resistive voltage-dividing means, depending on a logic state of each of bits of said digital data, said resistive voltage-dividing means having voltage-dividing resistors having different resistances depending on a selected gradation, the potential difference between reference voltages for the display of adjacent gradations being large enough to facilitate the expressions of the gradations.

20. A display unit according to claim 19, wherein said drive circuit comprises means for writing signals in the pixels of said pixel assembly in a line-sequential manner in each horizontal period.

21. A display unit according to claim 19, wherein said drive circuit is integrally formed with said pixel assembly on one substrate.

22. A display unit according to claim 19, wherein each of the pixels of said pixel assembly comprises a liquid crystal cell.

23. A display unit according to claim 22, wherein said drive circuit comprises means for driving the pixels of said pixel assembly in an inverted-common drive process in which a common voltage applied commonly to confronting electrodes of the liquid crystal cells is inverted in each horizontal period.

24. A display unit according to claim 19, wherein each of the pixels of said pixel assembly comprises an electroluminescent element.

25. A display unit comprising a pixel assembly having a matrix of pixels, a digital-to-analog converter for converting n-bit (n is an integer of 2 or greater) digital data into an analog signal, and a drive circuit for driving the pixels of said pixel assembly with said analog signal, said digital-to-analog converter comprising:

reference voltage generating means for generating a plurality of reference voltages;

resistive voltage-dividing means for generating $2^n$ reference voltages corresponding to n-bit (n is an integer of 2 or greater) digital data based on said reference voltages generated by said reference voltage generating means by way of resistive voltage division, and directly outputting the reference voltage for a particular gradation supplied from said reference voltage generating means as one of said $2^n$ reference voltages; and a gradation selecting circuit for selecting and outputting one of said $2^n$ reference voltages supplied from said resistive voltage-dividing means, depending on a logic state of each of bits of said digital data.

26. A display unit according to claim 25, wherein said drive circuit comprises means for writing signals in the pixels of said pixel assembly in a line-sequential manner in each horizontal period.

27. A display unit according to claim 25, wherein said drive circuit is integrally formed with said pixel assembly on one substrate.

28. A display unit according to claim 25, wherein each of the pixels of said pixel assembly comprises a liquid crystal cell.

29. A display unit according to claim 28, wherein said drive circuit comprises means for driving the pixels of said pixel assembly in an inverted-common drive process in which a common voltage applied commonly to confronting electrodes of the liquid crystal cells is inverted in each horizontal period.

30. A display unit according to claim 25, wherein each of the pixels of said pixel assembly comprises an electroluminescent element.

* * * * *